(12) United States Patent
Camacho et al.

(10) Patent No.: US 8,890,328 B2
(45) Date of Patent: Nov. 18, 2014

(54) SEMICONDUCTOR DEVICE AND METHOD OF FORMING VERTICAL INTERCONNECT STRUCTURE BETWEEN NON-LINEAR PORTIONS OF CONDUCTIVE LAYERS

(75) Inventors: Zigmund R. Camacho, Singapore (SG); Dioscoro A. Merilo, Singapore (SG); Jairus L. Pisigan, Singapore (SG); Frederick R. Dahilig, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/312,852

(22) Filed: Dec. 6, 2011

(65) Prior Publication Data

US 2012/0074567 A1  Mar. 29, 2012

Related U.S. Application Data

(62) Division of application No. 12/484,146, filed on Jun. 12, 2009, now Pat. No. 8,105,915.

(51) Int. Cl.
| | |
|---|---|
| *H01L 23/48* | (2006.01) |
| *H01L 25/10* | (2006.01) |
| *H01L 25/00* | (2006.01) |
| *H01L 25/065* | (2006.01) |
| *H01L 21/56* | (2006.01) |
| *H01L 23/31* | (2006.01) |
| *H01L 23/00* | (2006.01) |

(52) U.S. Cl.
CPC ... *H01L 23/3107* (2013.01); *H01L 2225/06558* (2013.01); *H01L 2924/01079* (2013.01); *H01L 25/105* (2013.01); *H01L 2224/73253* (2013.01); *H01L 2924/01322* (2013.01); *H01L 2224/16145* (2013.01); *H01L 25/50* (2013.01); *H01L 2924/13091* (2013.01); *H01L 25/0657* (2013.01); *H01L 2924/01047* (2013.01); *H01L 2924/014* (2013.01); *H01L 2225/1035* (2013.01); *H01L 2225/06513* (2013.01); *H01L 21/568* (2013.01); *H01L 2924/01004* (2013.01); *H01L 2924/01006* (2013.01); *H01L 2924/01082* (2013.01); *H01L 2924/1433* (2013.01); *H01L 2924/09701* (2013.01); *H01L 2924/01013* (2013.01); *H01L 2924/01029* (2013.01); *H01L 21/561* (2013.01); *H01L 2225/06517* (2013.01); *H01L 24/82* (2013.01); *H01L 2225/1058* (2013.01); *H01L 2924/01074* (2013.01); *H01L 2924/19041* (2013.01)

USPC ........... 257/777; 257/779; 257/780; 257/787

(58) Field of Classification Search
CPC ........... H01L 23/3114; H01L 23/3121; H01L 23/3128; H01L 23/3178; H01L 21/52; H01L 21/56; H01L 21/563; H01L 23/498; H01L 23/49811; H01L 23/49816; H01L 23/49827; H01L 23/52
USPC .................. 257/777, 779, E21.502, E23.116, 257/E25.006, E25.013, E23.085, 780, 787; 438/106–127

See application file for complete search history.

(56) References Cited

U.S. PATENT DOCUMENTS

| | | |
|---|---|---|
| 5,250,843 A | 10/1993 | Eichelberger |
| 5,353,498 A | 10/1994 | Fillion et al. |

(Continued)

*Primary Examiner* — Khiem D Nguyen
(74) *Attorney, Agent, or Firm* — Robert D. Atkins; Patent Law Group: Atkins and Associates, P.C.

(57) ABSTRACT

A semiconductor device is made by forming a first conductive layer over a first temporary carrier having rounded indentations. The first conductive layer has a non-linear portion due to the rounded indentations. A bump is formed over the non-linear portion of the first conductive layer. A semiconductor die is mounted over the carrier. A second conductive layer is formed over a second temporary carrier having rounded indentations. The second conductive layer has a non-linear portion due to the rounded indentations. The second carrier is mounted over the bump. An encapsulant is deposited between the first and second temporary carriers around the first semiconductor die. The first and second carriers are removed to leave the first and second conductive layers. A conductive via is formed through the first conductive layer and encapsulant to electrically connect to a contact pad on the first semiconductor die.

28 Claims, 13 Drawing Sheets

(56) References Cited

U.S. PATENT DOCUMENTS

| | | |
|---|---|---|
| 5,841,193 A | 11/1998 | Eichelberger |
| 6,025,648 A * | 2/2000 | Takahashi et al. ............ 257/778 |
| 6,573,121 B2 | 6/2003 | Yoneda et al. |
| 6,774,499 B1 * | 8/2004 | Yang ............................ 257/786 |
| 7,009,297 B1 * | 3/2006 | Chiang et al. ................. 257/738 |
| 7,190,080 B1 | 3/2007 | Leu et al. |
| 7,279,789 B2 * | 10/2007 | Cheng ........................... 257/713 |
| 7,619,901 B2 | 11/2009 | Eichelberger et al. |
| 7,888,181 B2 | 2/2011 | Camacho et al. |
| 8,084,302 B2 | 12/2011 | Do et al. |
| 2005/0248029 A1 * | 11/2005 | Chang ........................... 257/734 |
| 2007/0045788 A1 * | 3/2007 | Suzuki et al. ................. 257/666 |
| 2007/0158787 A1 * | 7/2007 | Chanchani ..................... 257/619 |
| 2009/0102066 A1 * | 4/2009 | Lee et al. ...................... 257/784 |
| 2010/0144152 A1 * | 6/2010 | Park et al. ..................... 438/694 |

* cited by examiner

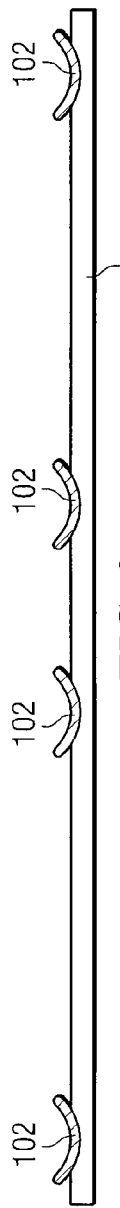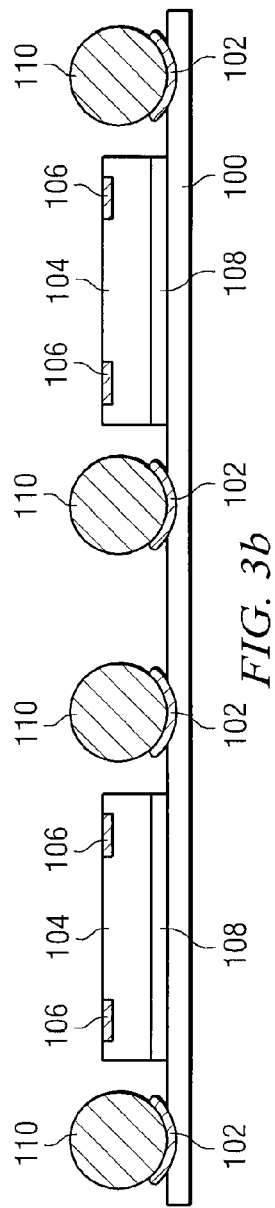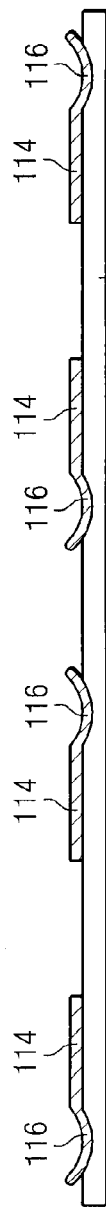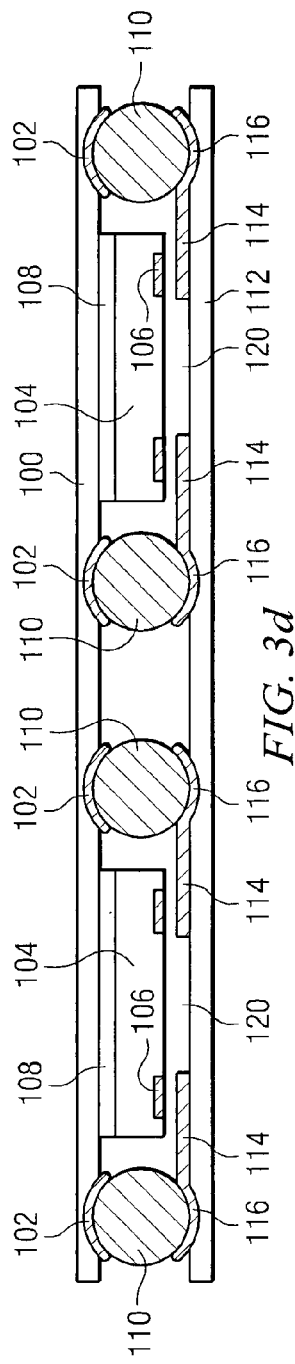

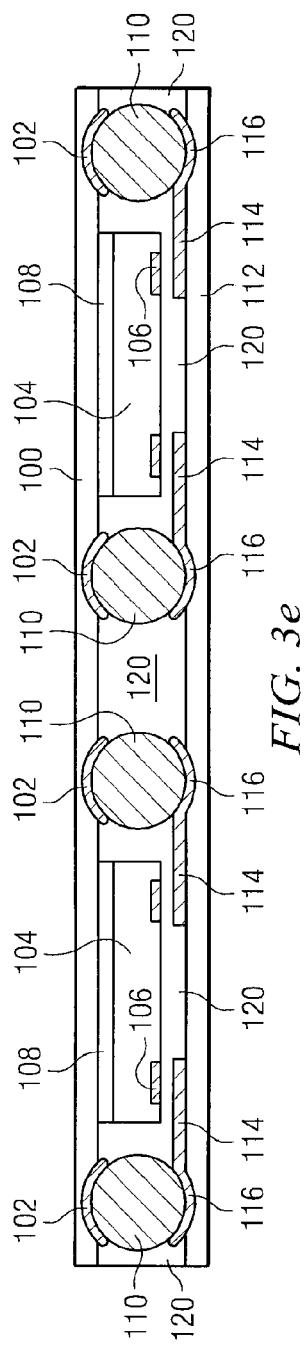
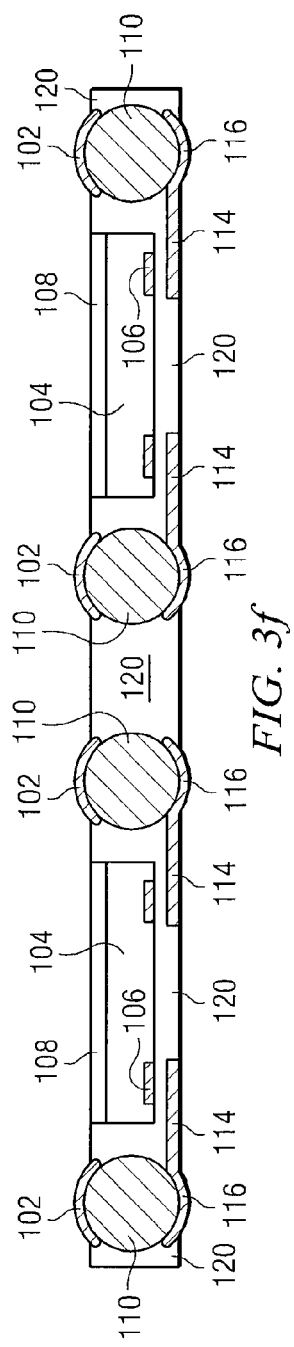
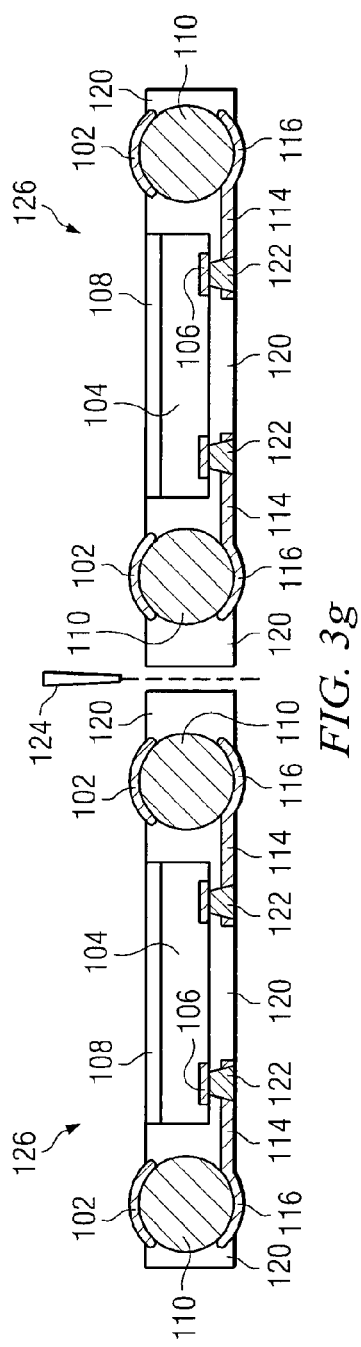
FIG. 3e
FIG. 3f
FIG. 3g

US 8,890,328 B2

SEMICONDUCTOR DEVICE AND METHOD OF FORMING VERTICAL INTERCONNECT STRUCTURE BETWEEN NON-LINEAR PORTIONS OF CONDUCTIVE LAYERS

CLAIM TO DOMESTIC PRIORITY

The present application is a division of U.S. patent application Ser. No. 12/484,146, filed Jun. 12, 2009, now U.S. Pat. No. 8,105,915, and claims priority to the foregoing parent application.

FIELD OF THE INVENTION

The present invention relates in general to semiconductor devices and, more particularly, to a semiconductor device and method of forming a vertical interconnect structure between non-linear portions of upper and lower conductive layers.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between a fan-out wafer level chip scale package (FO-WLCSP) containing semiconductor devices on multiple levels (3-D device integration) and external devices can be accomplished with conductive through silicon vias (TSV), through hole vias (THV), or Cu-plated conductive pillars. Vias are formed in silicon or organic material around the die using laser drilling or deep reactive ion etching (DRIE). The vias are filled with conductive material, for example by copper deposition through an electroplating process, to form the conductive TSVs and THVs. Redistribution layers (RDLs) are typically used to connect the THVs to the semiconductor die. The formation of TSV, THV, and RDLs involves special equipment, slow processes, and costly manufacturing steps.

Another area of concern is the continuing demand for smaller die sizes with higher input output (I/O) pin count, resulting from improvements in wafer fabrication in terms of fine-pitch capabilities and miniaturization. Manufactures often have difficulty fitting larger solder balls in smaller pitch requirements, such as found with industry standard motherboards which are oriented toward BGA-mounted devices. The small die with high I/O pin count remain a major challenge for FO-WLCSP packaging.

SUMMARY OF THE INVENTION

A need exists to form a vertical interconnect structure in a semiconductor package. Accordingly, in one embodiment, the present invention is a semiconductor device comprising a first semiconductor die and plurality of rounded bumps disposed proximate to the first semiconductor die. A first conductive layer has a linear portion disposed over the first semiconductor die and non-linear portion disposed over the rounded bumps. A second conductive layer has a non-linear portion disposed over the rounded bumps opposite the first conductive layer. An encapsulant is deposited around the first semiconductor die and rounded bumps. A plurality of first conductive vias is formed through the encapsulant to electrically connect the linear portion of the first conductive layer to the first semiconductor die.

In another embodiment, the present invention is a semiconductor device comprising a first semiconductor die and interconnect structure disposed proximate to the first semiconductor die. A first conductive layer has a non-linear portion disposed over a first surface of the interconnect structure. A second conductive layer has a non-linear portion disposed over a second surface of the interconnect structure opposite the first conductive layer. An encapsulant is deposited around the first semiconductor die and interconnect structure.

In another embodiment, the present invention is a semiconductor device comprising a first semiconductor die and interconnect structure having a non-linear surface disposed proximate to the first semiconductor die. A first conductive layer is disposed over the non-linear surface of the interconnect structure. A second conductive layer is disposed over the non-linear surface of the interconnect structure opposite the first conductive layer. An encapsulant is deposited around the first semiconductor die and interconnect structure.

In another embodiment, the present invention is a semiconductor device comprising a first semiconductor die and interconnect structure having a non-linear surface disposed proximate to the first semiconductor die. A first conductive layer is disposed over the non-linear surface of the interconnect structure. An encapsulant is deposited around the first semiconductor die and interconnect structure.

BRIEF DESCRIPTION OF THE DRAWINGS

FIGS. 3a-3g illustrate a process of forming a vertical interconnect structure between non-linear portions of upper and lower conductive layers;

DETAILED DESCRIPTION OF THE DRAWINGS

Figure 1:
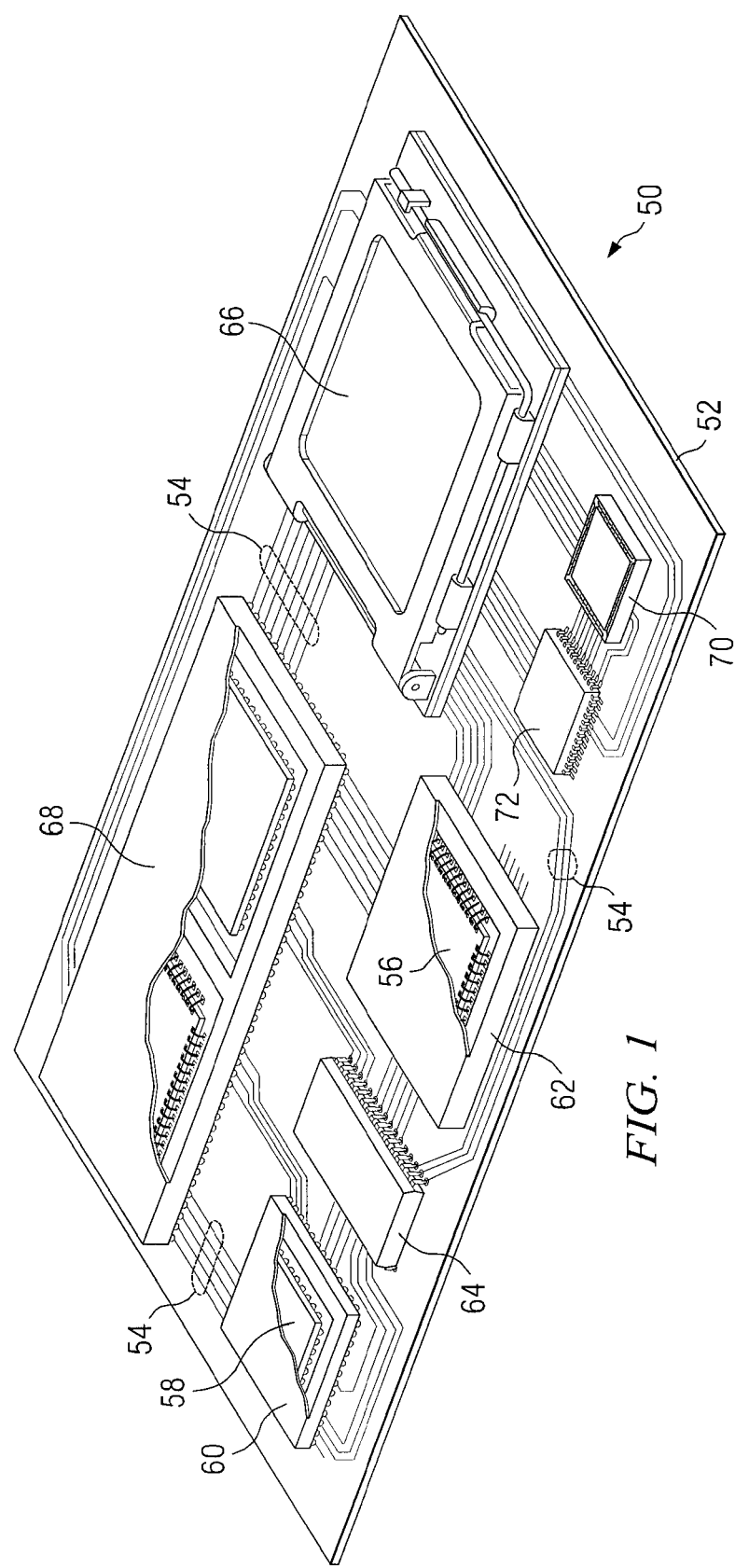
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
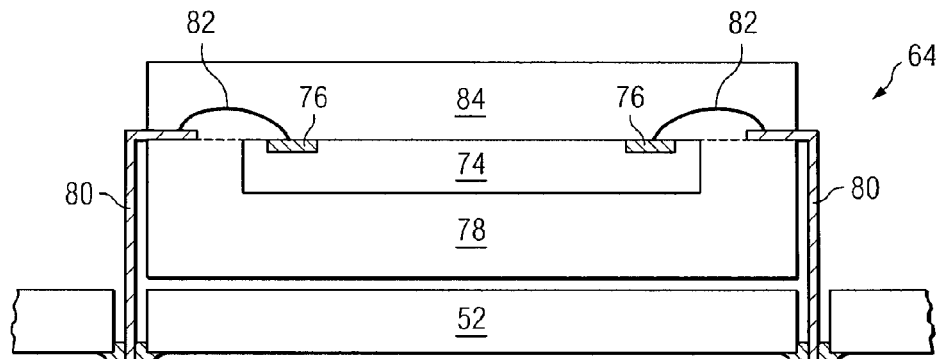
FIGS. 2a-2c illustrate further detail of the representative semiconductor packages mounted to the PCB.
Figure 2B:
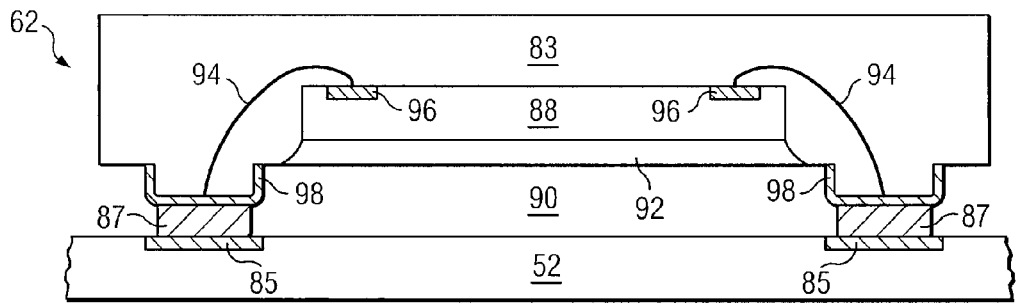
Figure 2C:
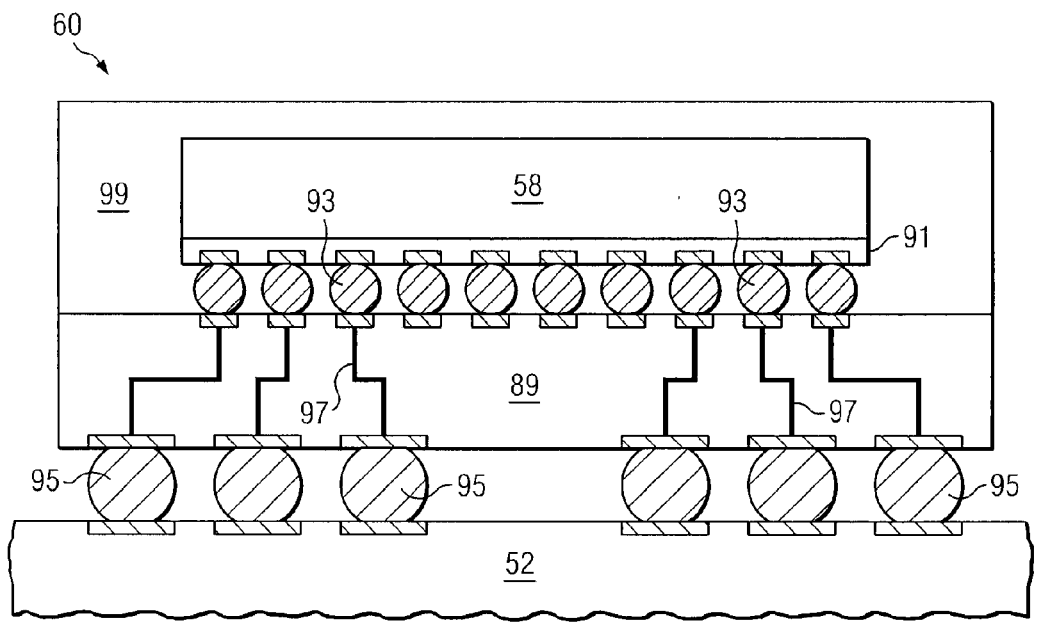

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 83 is deposited over semiconductor die 88 and wire bonds 94 to provide physical support and electrical isolation for the device. Contact pads 85 are formed over a surface of PCB 52 using a suitable metal deposition such electrolytic plating or electroless plating to prevent oxidation. Contact pads 85 are electrically connected to one or more conductive signal traces 54 in PCB 52. Bumps 87 are formed between contact pads 98 of BCC 62 and contact pads 85 of PCB 52.

In FIG. 2c, semiconductor die 58 is mounted face down to intermediate carrier 89 with a flip chip style first level packaging. Active region 91 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 91. Semiconductor die 58 is electrically and mechanically connected to carrier 89 through bumps 93.

BGA 60 is electrically and mechanically connected to PCB 52 with a BGA style second level packaging using bumps 95. Semiconductor die 58 is electrically connected to conductive signal traces 54 in PCB 52 through bumps 93, signal lines 97, and bumps 95. A molding compound or encapsulant 99 is deposited over semiconductor die 58 and carrier 89 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 89.

FIGS. 3a-3g illustrate a process of forming a vertical (z-direction) interconnect structure between non-linear portions of upper and lower conductive layers for a fan-out wafer level chip scale package (FO-WLCSP). In FIG. 3a, a temporary substrate or carrier 100 contains base material such as metal, silicon, polymer, polymer composite, ceramic, glass, glass epoxy, beryllium oxide, or other suitable low-cost, rigid material or bulk semiconductor material for structural support. In one embodiment, carrier 100 is a first plated Cu sheet.

A plurality of rounded or curved indentations is made in carrier 100. An electrically conductive layer 102 is conformally formed in the indentations of carrier 100 using a deposition and patterning process. Conductive layer 102 has a non-linear portion due to the rounded indentations in carrier 100. Conductive layer 102 is formed using PVD, CVD, sputtering, electrolytic plating, electroless plating process, or other suitable metal deposition process. Conductive layer 102 can be one or more layers of Al, Cu, Sn, Ni, Au, Ag, or other suitable electrically conductive material. In the case of the plated Cu sheet, conductive layer 102 can be taken from the indentations in the Cu sheet.

In FIG. 3b, a backside of semiconductor die 104 is mounted over carrier 100 with die attach adhesive 108 so that contact pads 106 are oriented upward. Semiconductor die 104 each include a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as digital signal processor (DSP), ASIC, memory, or other signal processing circuit. Semiconductor die 104 may also contain IPD, such as inductors, capacitors, and resistors, for RF signal processing. In another embodiment, a discrete component can be mounted over carrier 100.

An electrically conductive bump material is deposited over conductive layer 102 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 102 using a suitable attachment or bonding process. In one embodiment, the bump material is reflowed by heating the material above its melting point to form spherical balls or bumps 110. In some applications, bumps 110 are reflowed a second time to improve electrical contact to conductive layer 102. The bumps can also be compression bonded to conductive layer 102. Bumps 110 represent one type of interconnect structure that can be formed over conductive layer 102. The interconnect structure can also use bond wires, conductive paste, stud bump, micro bump, or other electrical interconnect.

In FIG. 3c, a temporary substrate or carrier 112 contains base material such as metal, silicon, polymer, polymer composite, ceramic, glass, glass epoxy, beryllium oxide, or other suitable low-cost, rigid material or bulk semiconductor material for structural support. In one embodiment, carrier 112 is a second plated Cu sheet.

A plurality of rounded or curved indentations is made in carrier 112. An electrically conductive layer 114 is conformally formed over carrier 112 and further into the indentations of carrier 112 using a deposition and patterning process. The portion of conductive layer 114 formed in the indentations of carrier 112 is denoted as portion 116. Conductive layer 114 thus has a linear portion and non-linear portion due to the flat surface and rounded indentations in carrier 112. The non-linear portions 102 and 116 conform to opposite sides of the curved surface of bump 110. Conductive layer 114 is formed using PVD, CVD, sputtering, electrolytic plating, electroless plating process, or other suitable metal deposition process. Conductive layer 114 can be one or more layers of Al, Cu, Sn, Ni, Au, Ag, or other suitable electrically conductive material.

In FIG. 3d, carrier 100 with semiconductor die 104 and bumps 110 is inverted and placed over carrier 112. Bumps 110 are disposed within portion 116 of conductive layer 114. Accordingly, vertically opposite sides of bumps 110 electrically connect to conductive layers 102 and 114, respectively.

FIG. 3e shows an encapsulant or molding compound 120 deposited between carriers 100 and 112 around semiconductor die 104 and bumps 110 using a paste printing, compressive molding, transfer molding, liquid encapsulant molding, vacuum lamination, or other suitable applicator. Encapsulant 120 can be polymer composite material, such as epoxy resin with filler, epoxy acrylate with filler, or polymer with proper filler. Encapsulant 120 is non-conductive and environmentally protects the semiconductor device from external elements and contaminants.

In FIG. 3f, carriers 100 and 112 are removed by strip etching, chemical etching, mechanical peel-off, CMP, mechanical grinding, thermal bake, laser scanning, or wet stripping. Conductive layers 102 and 114 remain in place within encapsulant 120, electrically connected to vertically opposite sides of bumps 110.

In FIG. 3g, a plurality of vias 122 is formed through conductive layer 114 and encapsulant 120 to contact pads 106 of semiconductor die 104 by deep reactive ion etching (DRIE) or laser drilling process. The vias 122 are filled with Al, Cu, Sn, Ni, Au, Ag, titanium (Ti), W, poly-silicon, or other suitable electrically conductive material using PVD, CVD, electrolytic plating, electroless plating process, or other suitable metal deposition process. Semiconductor die 104 are singulated with saw blade or laser cutting device 124 into individual semiconductor devices 126.

Figure 4:
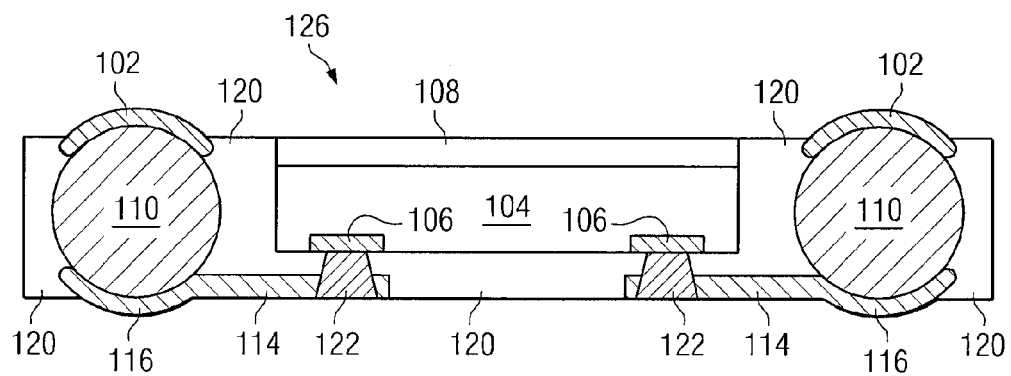
FIG. 4 illustrates the FO-WLCSP with the vertical interconnect structure formed between non-linear portions of upper and lower conductive layers.
Figure 5:
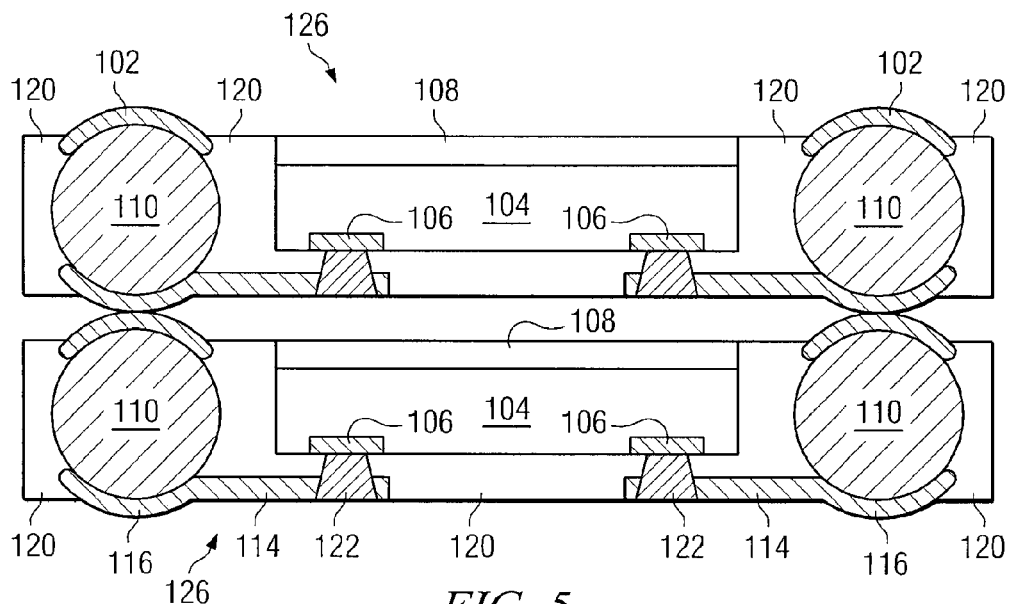
FIG. 5 illustrates stacked FO-WLCSPs electrically connected through the vertical interconnect structure.

FIG. 4 shows semiconductor package 126 after singulation. FIG. 5 shows two stacked semiconductor packages 126. Bumps 110 provide vertical, z-direction interconnect between conductive layers 102 and 114. Conductive layer 102, bumps 110, and conductive layer 114 electrically connect to contact pads 106 of each semiconductor die 104 through conductive vias 122. Semiconductor package 126 offers a lower cost structure by providing top and bottom interconnect surfaces for stacking FO-WLSCP, without forming redistribution layer (RDLs) as found in the prior art.

Figure 6:
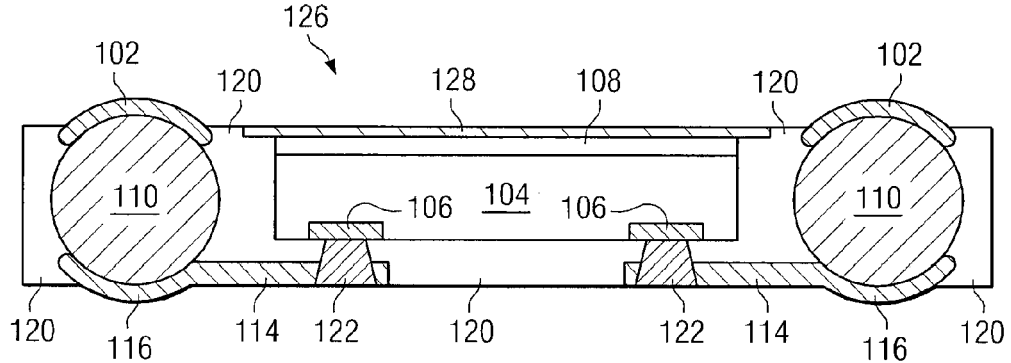
FIG. 6 illustrates the FO-WLCSP with vertical interconnect structure and die pad.

An alternate embodiment is shown in FIG. 6 with die pad 128 which can be formed over carrier 100 concurrently with conductive layer 102.

Figure 7A:
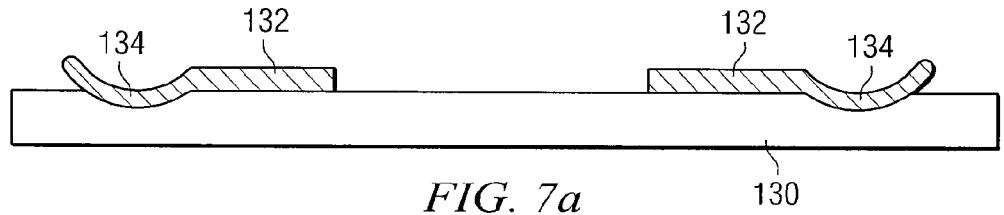
FIGS. 7a-7h illustrate an alternate process of forming the vertical interconnect structure between non-linear portions of upper and lower conductive layers.

FIGS. 7a-7h illustrate an alternate process of forming a vertical, z-direction interconnect structure between non-linear portions of upper and lower conductive layers for a FO-WLCSP. In FIG. 7a, a temporary substrate or carrier 130 contains base material such as metal, silicon, polymer, polymer composite, ceramic, glass, glass epoxy, beryllium oxide, or other suitable low-cost, rigid material or bulk semiconductor material for structural support. In one embodiment, carrier 130 is a plated Cu sheet.

A plurality of rounded or curved indentations is made in carrier 130. An electrically conductive layer 132 is conformally formed over carrier 130 and further into the indentations of carrier 130 using a deposition and patterning process. The portion of conductive layer 132 formed in the indentations of carrier 130 is denoted as portion 134. Conductive layer 132 thus has a linear portion and non-linear portion due to the flat surface and rounded indentations in carrier 132. Conductive layer 132 is formed using PVD, CVD, sputtering, electrolytic plating, electroless plating process, or other suitable metal deposition process. Conductive layer 132 can be one or more layers of Al, Cu, Sn, Ni, Au, Ag, or other suitable electrically conductive material.

Figure 7B:
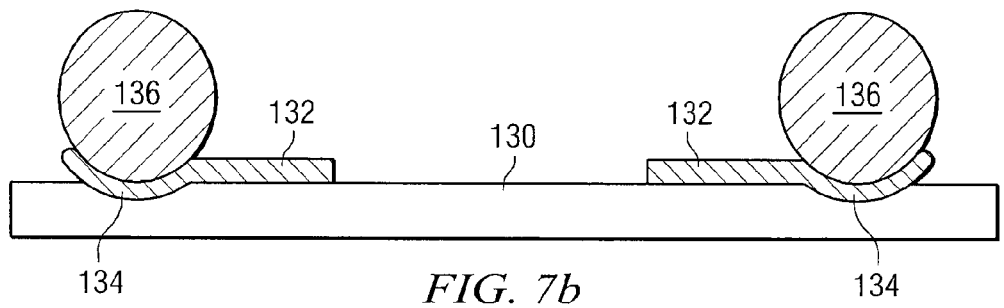

In FIG. 7b, an electrically conductive bump material is deposited over portion 134 of conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form spherical balls or bumps 136. In some applications, bumps 136 are reflowed a second time to improve electrical contact to conductive layer 132. The bumps can also be compression bonded to conductive layer 132. Bumps 136 represent one type of vertical, z-direction interconnect structure that can be formed over conductive layer 132. Multiple rows of bumps 136 increase the z-direction interconnect capacity. The interconnect structure can also use conductive pillars, stud bump, micro bump, or other electrical interconnect.

Figure 7C:
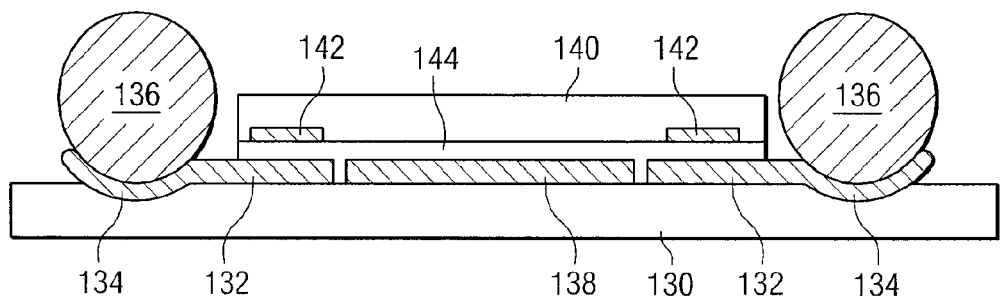

In FIG. 7c, die pad 138 is formed over carrier 130 between sections of conductive layer 132. Die pad 138 can be formed concurrent with conductive layer 132. The front-side of semiconductor die 140 is mounted over conductive layer 132 and die pad 138 with die attach adhesive 144 so that contact pads 142 are oriented downward. Semiconductor die 140 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as DSP, ASIC, memory, or other signal processing circuit. Semiconductor die 140 may also contain IPD, such as inductors, capacitors, and resistors, for RF signal processing.

Figure 7D:
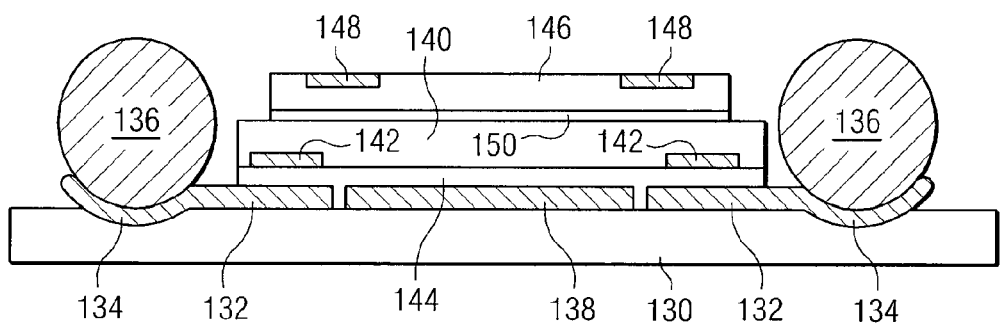

In FIG. 7d, the backside of semiconductor die 146 is mounted over the backside of semiconductor die 140 with die attach adhesive 150 so that contact pads 148 are oriented upward. Semiconductor die 146 is a different type of device and has a smaller footprint than semiconductor die 140. Semiconductor die 146 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as DSP, ASIC, memory, or other signal processing circuit. Semiconductor die 146 may also contain IPD, such as inductors, capacitors, and resistors, for RF signal processing.

Figure 7E:
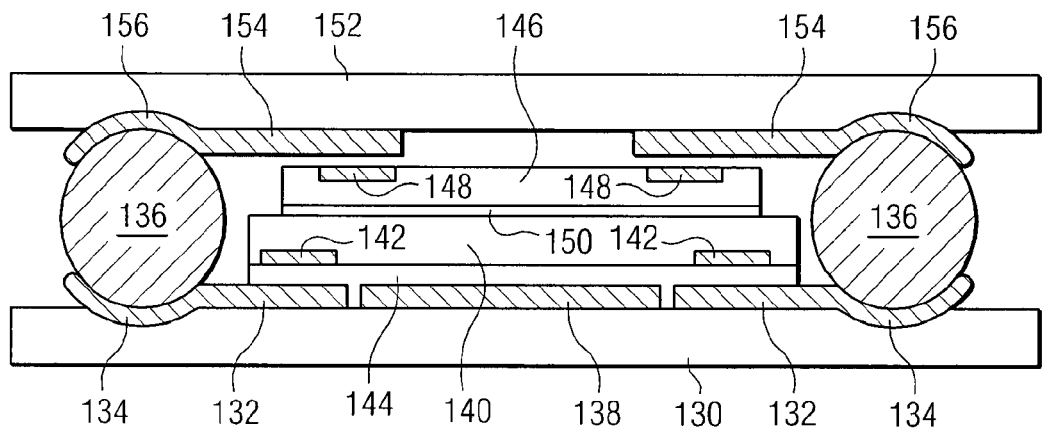

In FIG. 7e, a temporary substrate or carrier 152 contains base material such as metal, silicon, polymer, polymer composite, ceramic, glass, glass epoxy, beryllium oxide, or other suitable low-cost, rigid material or bulk semiconductor material for structural support. In one embodiment, carrier 152 is a plated Cu sheet.

A plurality of rounded or curved indentations is made in carrier 152. An electrically conductive layer 154 is conformally formed over carrier 152 and further into the indentations of carrier 152 using a deposition and patterning process. The portion of conductive layer 154 formed in the indentations of carrier 152 is denoted as portion 156. Conductive layer 154 thus has a linear portion and non-linear portion due to the flat surface and rounded indentations in carrier 152. The non-linear portions 134 and 156 conform to opposite sides of the curved surface of bump 136. Conductive layer 154 is formed using PVD, CVD, sputtering, electrolytic plating, electroless plating process, or other suitable metal deposition process. Conductive layer 154 can be one or more layers of Al, Cu, Sn, Ni, Au, Ag, or other suitable electrically conductive material.

Carrier 152 is placed over semiconductor die 140 and 146 and carrier 130 so that bumps 136 are disposed within portion 156 of conductive layer 154. Accordingly, vertically opposite sides of bumps 136 electrically connect to conductive layers 132 and 154, respectively.

Figure 7F:
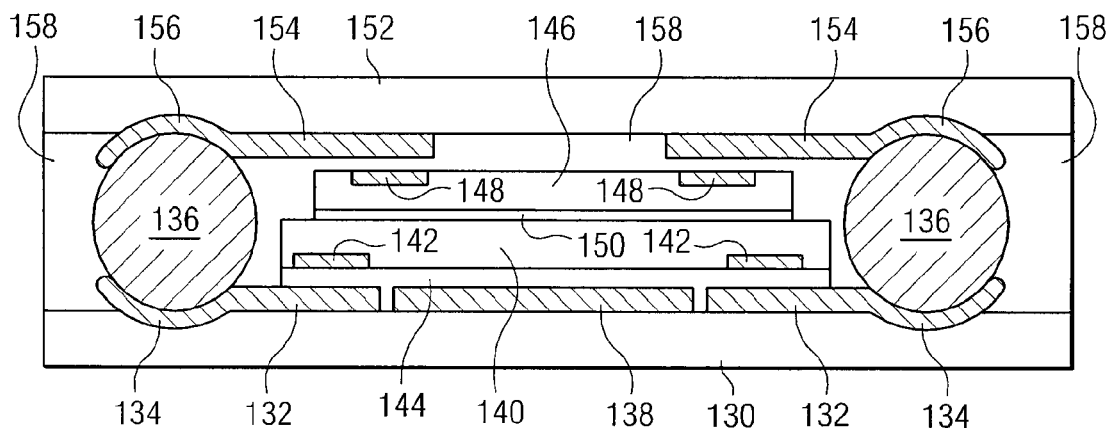

FIG. 7f shows an encapsulant or molding compound 158 deposited between carriers 130 and 152 around semiconductor die 140 and 146 and bumps 136 using a paste printing, compressive molding, transfer molding, liquid encapsulant molding, vacuum lamination, or other suitable applicator. Encapsulant 158 can be polymer composite material, such as epoxy resin with filler, epoxy acrylate with filler, or polymer with proper filler. Encapsulant 158 is non-conductive and environmentally protects the semiconductor device from external elements and contaminants.

Figure 7G:
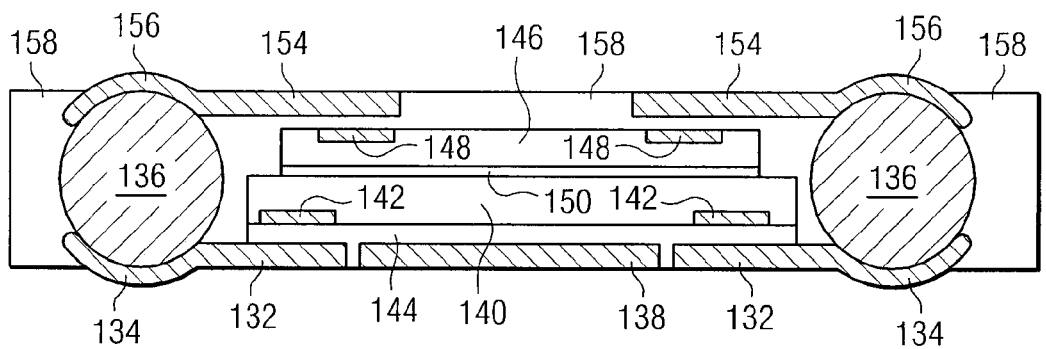

In FIG. 7g, carriers 130 and 152 are removed by strip etching, chemical etching, mechanical peel-off, CMP, mechanical grinding, thermal bake, laser scanning, or wet stripping. Conductive layers 132 and 154 remain in place within encapsulant 158, electrically connected to vertically opposite sides of bumps 136.

Figure 7H:
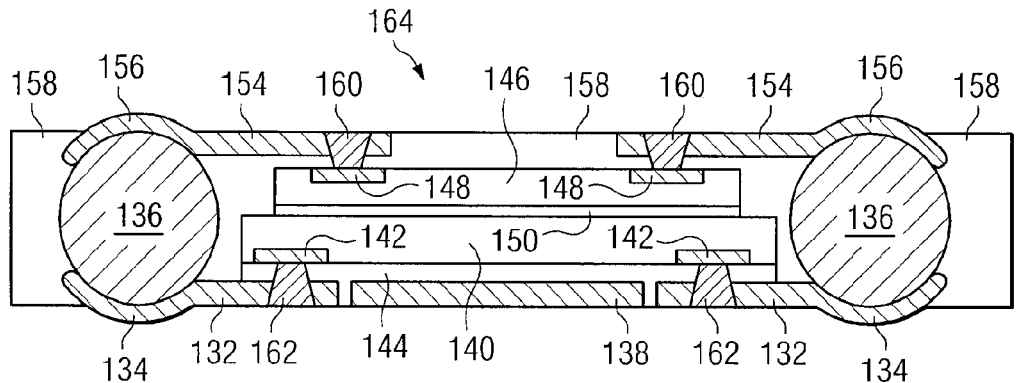

In FIG. 7h, a plurality of vias 160 is formed through conductive layer 154 and encapsulant 158 to contact pads 148 of semiconductor die 146 by DRIE or laser drilling process. Likewise, a plurality of vias 162 is formed through conductive layer 132 and die attach adhesive 144 to contact pads 142 of semiconductor die 140 by DRIE or laser drilling. The vias 160 and 162 are filled with Al, Cu, Sn, Ni, Au, Ag, Ti, W, poly-silicon, or other suitable electrically conductive material using PVD, CVD, electrolytic plating, electroless plating process, or other suitable metal deposition process.

In semiconductor package 164, bumps 136 provide vertical, z-direction interconnect between conductive layers 132 and 154. Conductive layer 132, bumps 136, and conductive layer 154 electrically connect to contact pads 142 of semiconductor die 140 and contact pads 148 of semiconductor die 146 through conductive vias 160 and 162, respectively. Semiconductor package 164 offers a lower cost structure by providing top and bottom interconnect surfaces for stacking FO-WLSCP, without forming RDLs as found in the prior art.

Figure 8:
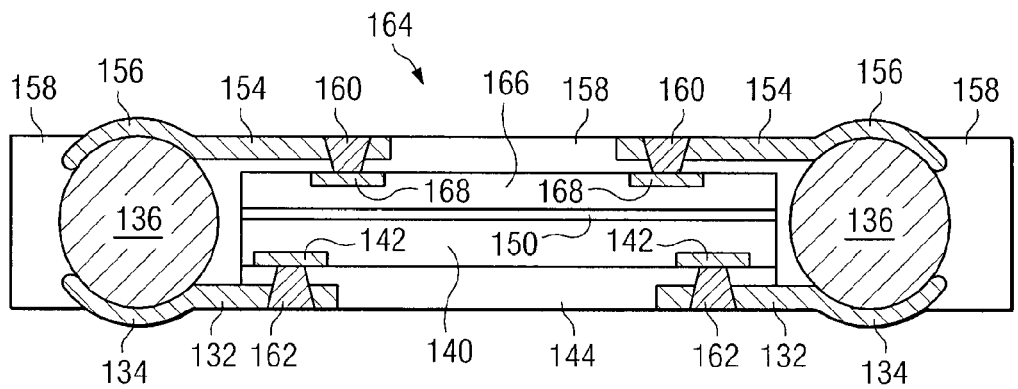
FIG. 8 illustrates the FO-WLCSP with vertical interconnect structure from FIGS. 7a-7h and similar-sized stacked die.

FIG. 8 shows an embodiment of semiconductor package 164 following the description of FIGS. 7a-7h with semiconductor die 140 and 166 having a similar footprint, for example, because they are equivalent devices.

Figure 9A:
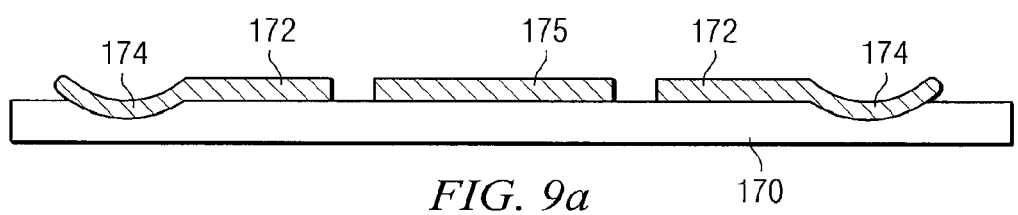
FIGS. 9a-9g illustrate an alternate process of forming the vertical interconnect structure between non-linear portions of upper and lower conductive layers.

FIGS. 9a-9g illustrate another process of forming a vertical, z-direction interconnect structure for a FO-WLCSP. In FIG. 9a, a temporary substrate or carrier 170 contains base material such as metal, silicon, polymer, polymer composite, ceramic, glass, glass epoxy, beryllium oxide, or other suitable low-cost, rigid material or bulk semiconductor material for structural support. In one embodiment, carrier 170 is a plated Cu sheet.

A plurality of rounded or curved indentations is made in carrier 170. An electrically conductive layer 172 is conformally formed over carrier 170 and further into the indentations of carrier 170 using a deposition and patterning process. The portion of conductive layer 172 formed in the indentations of carrier 170 is denoted as portion 174. Conductive layer 172 thus has a linear portion and non-linear portion due to the flat surface and rounded indentations in carrier 170. Conductive layer 172 is formed using PVD, CVD, sputtering, electrolytic plating, electroless plating process, or other suitable metal deposition process. Conductive layer 172 can be one or more layers of Al, Cu, Sn, Ni, Au, Ag, or other suitable electrically conductive material. A die pad 175 is formed over carrier 170 between sections of conductive layer 172. Die pad 175 can be formed concurrent with conductive layer 172.

Figure 9B:
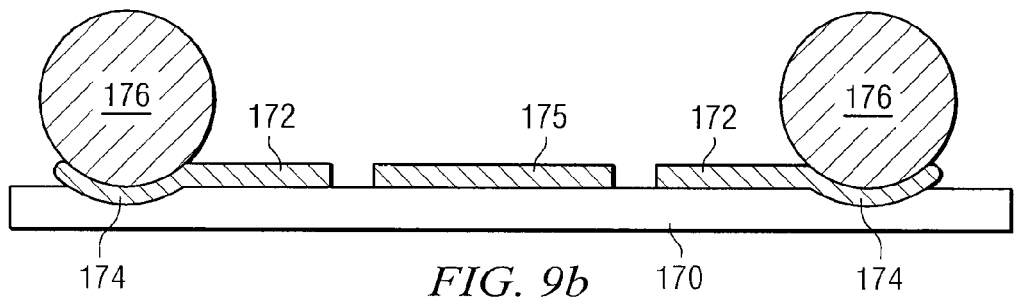

In FIG. 9b, an electrically conductive bump material is deposited over portion 174 of conductive layer 172 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 172 using a suitable attachment or bonding process. In one embodiment, the bump material is reflowed by heating the material above its melting point to form spherical balls or bumps 176. In some applications, bumps 176 are reflowed a second time to improve electrical contact to conductive layer 172. The bumps can also be compression bonded to conductive layer 172. Bumps 176 represent one type of vertical, z-direction interconnect structure that can be formed over conductive layer 172. Multiple rows of bumps 176 increase the z-direction interconnect capacity. The interconnect structure can also use conductive pillars, stud bump, micro bump, or other electrical interconnect.

Figure 9C:
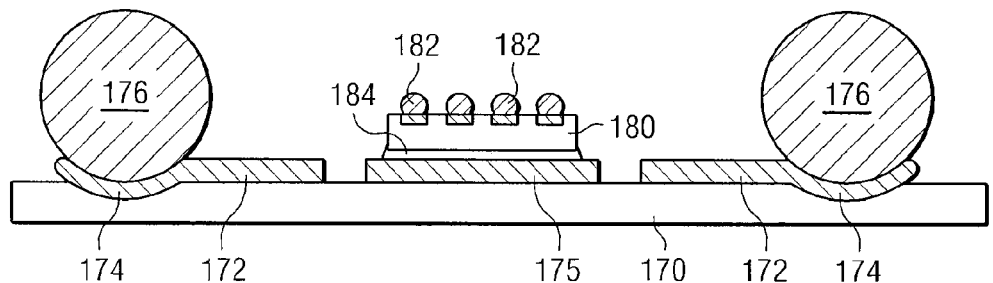

In FIG. 9c, a backside of semiconductor die 180 is mounted over die pad 175 with die attach adhesive 184 so that bumps 182 are oriented upward. Semiconductor die 180 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as DSP, ASIC, memory, or other signal processing circuit. Semiconductor die 180 may also contain IPD, such as inductors, capacitors, and resistors, for RF signal processing.

Figure 9D:
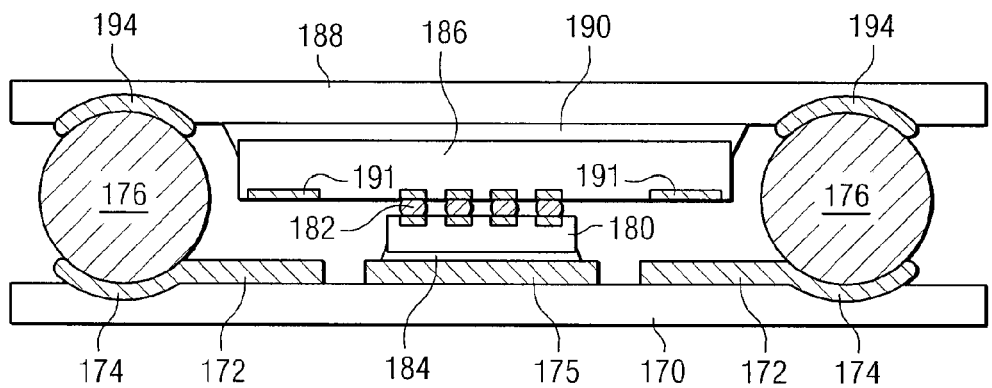

In FIG. 9d, semiconductor die 186 is mounted over carrier 188 with die attach adhesive 190 and electrically connected to bumps 182 with contact pads 191. Semiconductor die 186 is a different type of device and has a larger footprint than semiconductor die 180. Semiconductor die 186 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as DSP, ASIC, memory, or other signal processing circuit. Semiconductor die 186 may also contain IPD, such as inductors, capacitors, and resistors, for RF signal processing.

A plurality of rounded or curved indentations is made in carrier 188. An electrically conductive layer 194 is conformally formed in the indentations of carrier 188 using a deposition and patterning process. Conductive layer 194 thus has a non-linear portion due to the rounded indentations in carrier 188. The non-linear portions 174 and 194 conform to opposite sides of the curved surface of bump 176. Conductive layer 194 is formed using PVD, CVD, sputtering, electrolytic plating, electroless plating process, or other suitable metal deposition process. Conductive layer 194 can be one or more layers of Al, Cu, Sn, Ni, Au, Ag, or other suitable electrically conductive material.

Carrier 188 is placed over semiconductor die 180 and 186 and carrier 170 so that conductive layer 194 is disposed over bumps 176. Accordingly, vertically opposite sides of bumps 176 electrically connect to conductive layers 174 and 194, respectively.

Figure 9E:
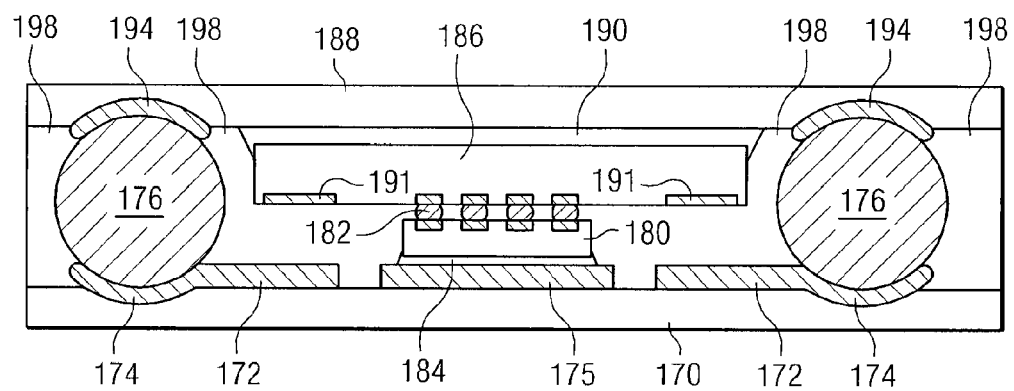

FIG. 9e shows an encapsulant or molding compound 198 deposited between carriers 170 and 188 around semiconductor die 180 and 186 and bumps 176 using a paste printing, compressive molding, transfer molding, liquid encapsulant molding, vacuum lamination, or other suitable applicator. Encapsulant 198 can be polymer composite material, such as epoxy resin with filler, epoxy acrylate with filler, or polymer with proper filler. Encapsulant 198 is non-conductive and environmentally protects the semiconductor device from external elements and contaminants.

Figure 9F:
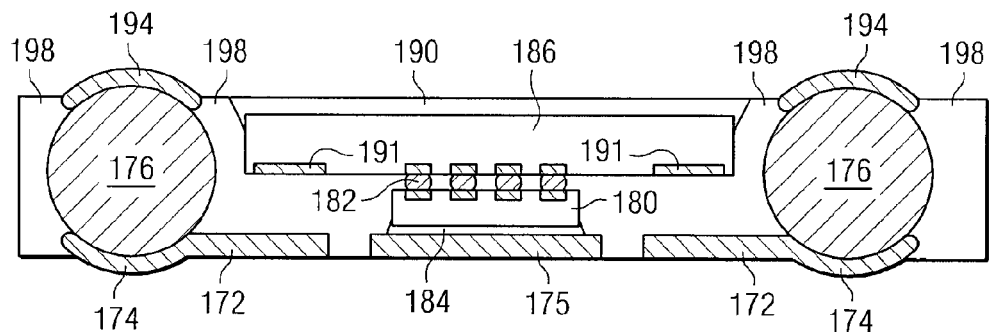

In FIG. 9f, carriers 170 and 188 are removed by strip etching, chemical etching, mechanical peel-off, CMP, mechanical grinding, thermal bake, laser scanning, or wet stripping. Conductive layers 172 and 194 remain in place within encapsulant 198, electrically connected to vertically opposite sides of bumps 176.

Figure 9G:
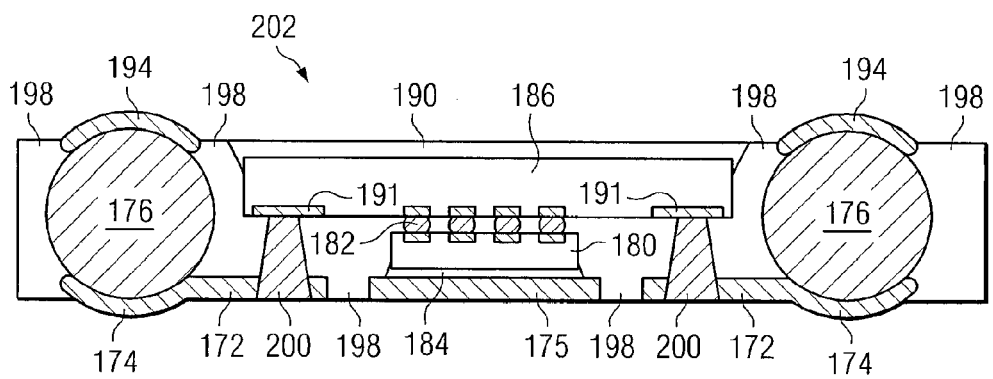

In FIG. 9g, a plurality of vias 200 is formed through conductive layer 172 and encapsulant 198 to contact pads 191 of semiconductor die 186 by DRIE or laser drilling process. The vias 200 are filled with Al, Cu, Sn, Ni, Au, Ag, Ti, W, polysilicon, or other suitable electrically conductive material using PVD, CVD, electrolytic plating, electroless plating process, or other suitable metal deposition process.

In semiconductor package 202, bumps 176 provide vertical, z-direction interconnect between conductive layers 172 and 194. Conductive layer 172, bumps 176, and conductive layer 194 electrically connect to contact pads 191 of semiconductor die 184 through conductive vias 200. Semiconductor package 202 offers a lower cost structure by providing top and bottom interconnect surfaces for stacking FO-WLSCP, without forming RDLs as found in the prior art.

Figure 10:
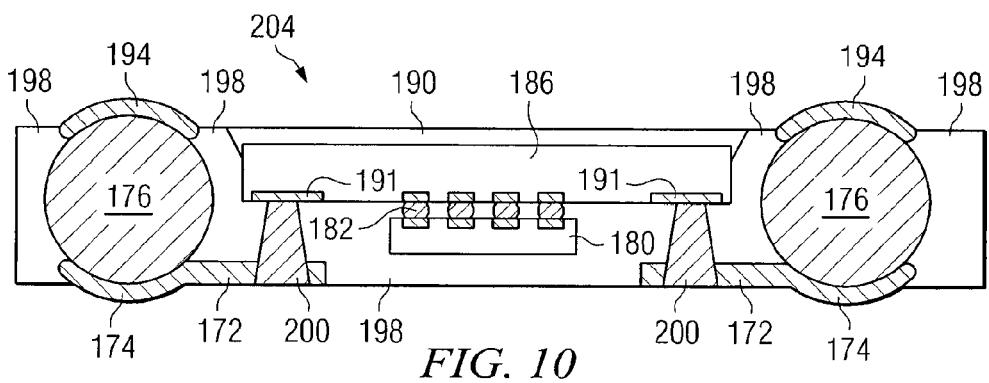
FIG. 10 illustrates the FO-WLCSP with the vertical interconnect structure from FIGS. 9a-9g and dissimilar-sized stacked die formed at the wafer level.

FIG. 10 shows an embodiment of semiconductor package 204 following the description of FIGS. 9a-9g with semiconductor die 180 and 186 stacked at the wafer level. Consequently, semiconductor die 180 is not mounted to carrier 170 during the manufacturing process and is thus disposed within encapsulant 198.

Figure 11A:
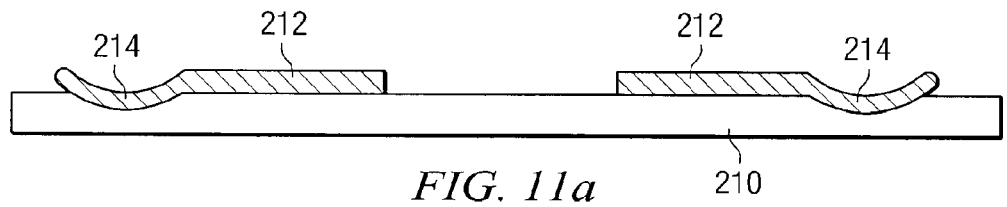
FIGS. 11a-11h illustrate an alternate process of forming a vertical interconnect structure between non-linear portion of upper and lower conductive layers.

In another embodiment, FIG. 11a shows temporary substrate or carrier 210 containing base material such as metal, silicon, polymer, polymer composite, ceramic, glass, glass epoxy, beryllium oxide, or other suitable low-cost, rigid material or bulk semiconductor material for structural support. In one embodiment, carrier 210 is a plated Cu sheet.

A plurality of rounded or curved indentations is made in carrier 210. An electrically conductive layer 212 is conformally formed over carrier 210 and further into the indentations of carrier 210 using a deposition and patterning process. The portion of conductive layer 212 formed in the indentations of carrier 210 is denoted as portion 214. Conductive layer 212 thus has a linear portion and non-linear portion due to the flat surface and rounded indentations in carrier 210. Conductive layer 212 is formed using PVD, CVD, sputtering, electrolytic plating, electroless plating process, or other suitable metal deposition process. Conductive layer 212 can be one or more layers of Al, Cu, Sn, Ni, Au, Ag, or other suitable electrically conductive material.

Figure 11B:
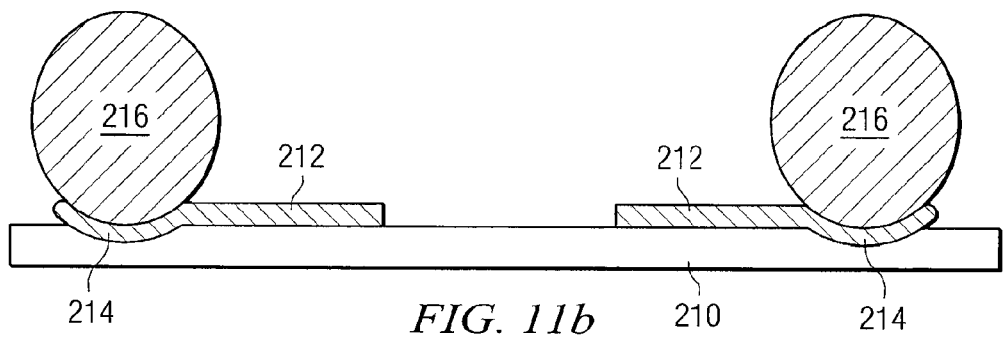

In FIG. 11b, an electrically conductive bump material is deposited over portion 214 of conductive layer 212 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 212 using a suitable attachment or bonding process. In one embodiment, the bump material is reflowed by heating the material above its melting point to form spherical balls or bumps 216. In some applications, bumps 216 are reflowed a second time to improve electrical contact to conductive layer 212. The bumps can also be compression bonded to conductive layer 212. Bumps 216 represent one type of vertical, z-direction interconnect structure that can be formed over conductive layer 212. Multiple rows of bumps 216 increase the z-direction interconnect capacity. The interconnect structure can also use conductive pillars, stud bump, micro bump, or other electrical interconnect.

Figure 11C:
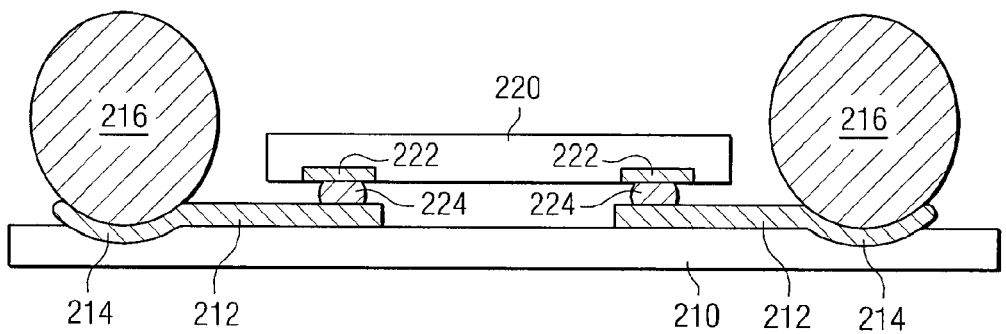

In FIG. 11c, semiconductor die 220 is mounted over conductive layer 212 with contact pads 222 oriented downward. Bumps 224 electrically connect contact pads 222 to conductive layer 212. Semiconductor die 220 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as DSP, ASIC, memory, or other signal processing circuit. Semiconductor die 220 may also contain IPD, such as inductors, capacitors, and resistors, for RF signal processing.

Figure 11D:
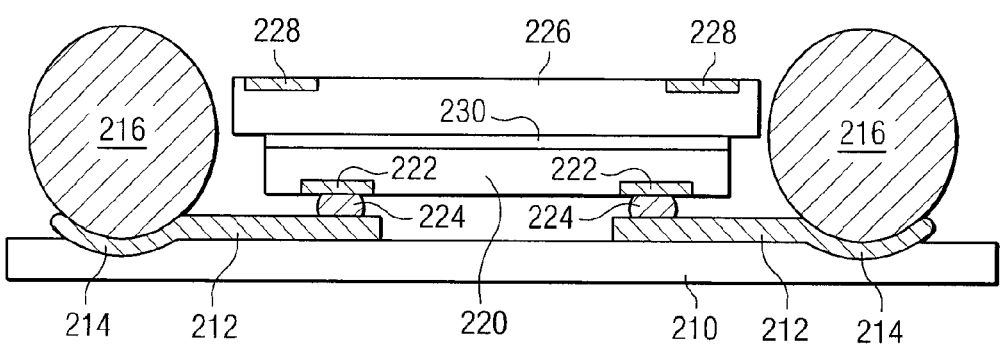

In FIG. 11d, a backside of semiconductor die 226 is mounted over the backside of semiconductor die 220 with die attach adhesive 230 so that contact pads 228 are oriented upward. Semiconductor die 226 is a different type of device and has a larger footprint than semiconductor die 220. Semiconductor die 226 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as DSP, ASIC, memory, or other signal processing circuit. Semiconductor die 226 may also contain IPD, such as inductors, capacitors, and resistors, for RF signal processing.

Figure 11E:
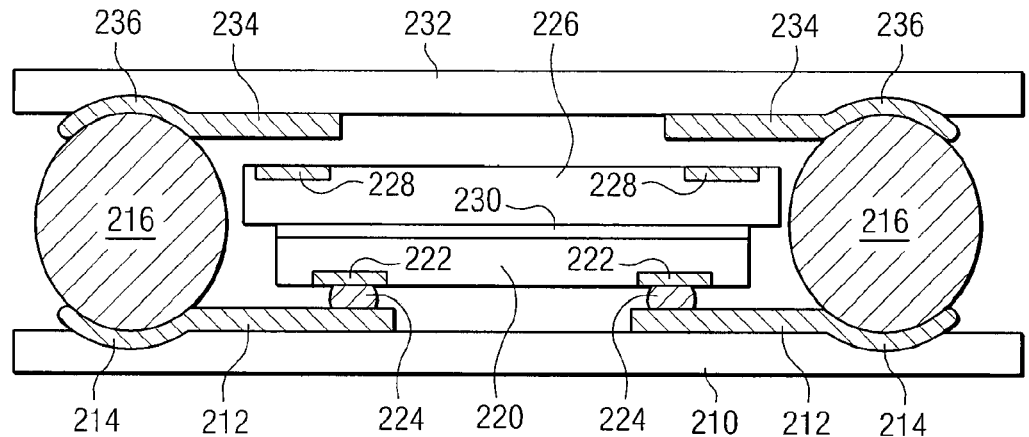

In FIG. 11e, a temporary substrate or carrier 232 contains base material such as metal, silicon, polymer, polymer composite, ceramic, glass, glass epoxy, beryllium oxide, or other suitable low-cost, rigid material or bulk semiconductor material for structural support. In one embodiment, carrier 232 is a plated Cu sheet.

A plurality of rounded or curved indentations is made in carrier 232. An electrically conductive layer 234 is conformally formed over carrier 232 and further into the indentations of carrier 232 using a deposition and patterning process. The portion of conductive layer 234 formed in the indentations of carrier 232 is denoted as portion 236. Conductive layer 234 thus has a linear portion and non-linear portion due to the flat surface and rounded indentations in carrier 232. The non-linear portions 214 and 236 conform to opposite sides of the curved surface of older bump 216. Conductive layer 234 is formed using PVD, CVD, sputtering, electrolytic plating, electroless plating process, or other suitable metal deposition process. Conductive layer 234 can be one or more layers of Al, Cu, Sn, Ni, Au, Ag, or other suitable electrically conductive material.

Carrier 232 is placed over semiconductor die 220 and 226 and carrier 210 so that bumps 216 are disposed within portion 236 of conductive layer 234. Accordingly, vertically opposite sides of bumps 216 electrically connect to conductive layers 212 and 234, respectively.

Figure 11F:
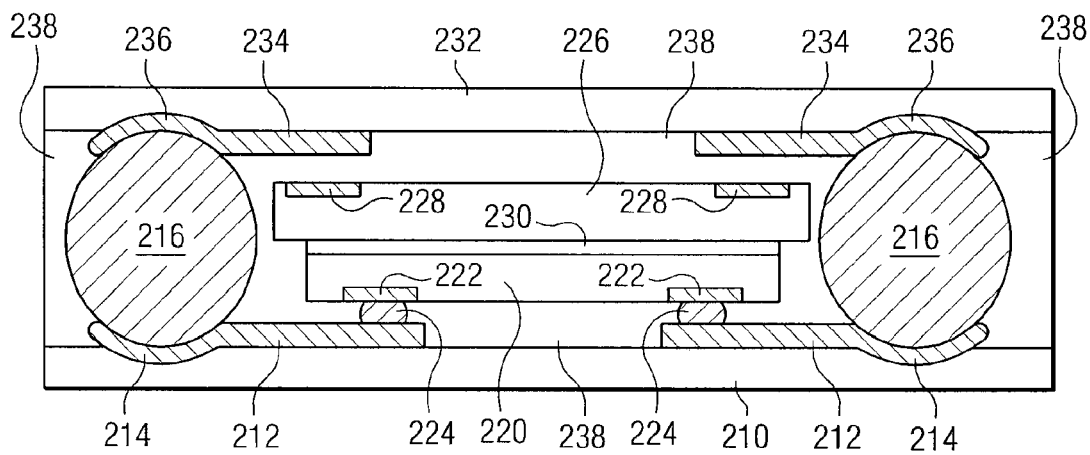

FIG. 11f shows an encapsulant or molding compound 238 deposited between carriers 210 and 232 around semiconductor die 220 and 226 and bumps 216 using a paste printing, compressive molding, transfer molding, liquid encapsulant molding, vacuum lamination, or other suitable applicator. Encapsulant 238 can be polymer composite material, such as epoxy resin with filler, epoxy acrylate with filler, or polymer with proper filler. Encapsulant 238 is non-conductive and environmentally protects the semiconductor device from external elements and contaminants.

Figure 11G:
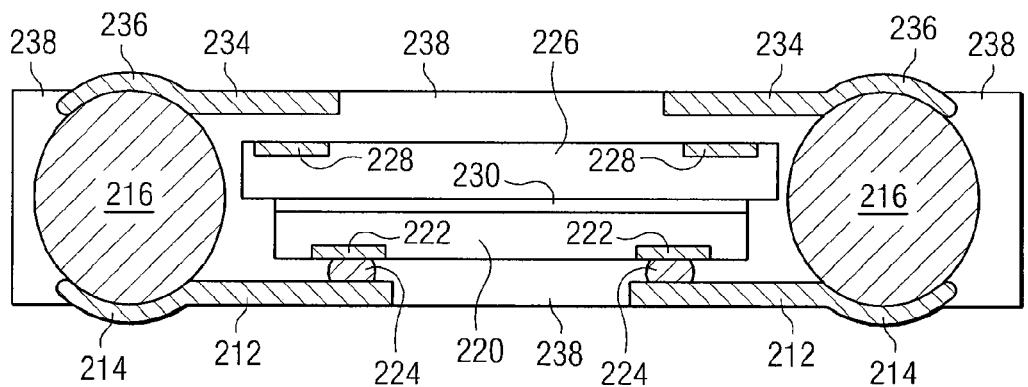

In FIG. 11g, carriers 210 and 232 are removed by strip etching, chemical etching, mechanical peel-off, CMP, mechanical grinding, thermal bake, laser scanning, or wet stripping. Conductive layers 212 and 234 remain in place within encapsulant 238, electrically connected to vertically opposite sides of bumps 216.

Figure 11H:
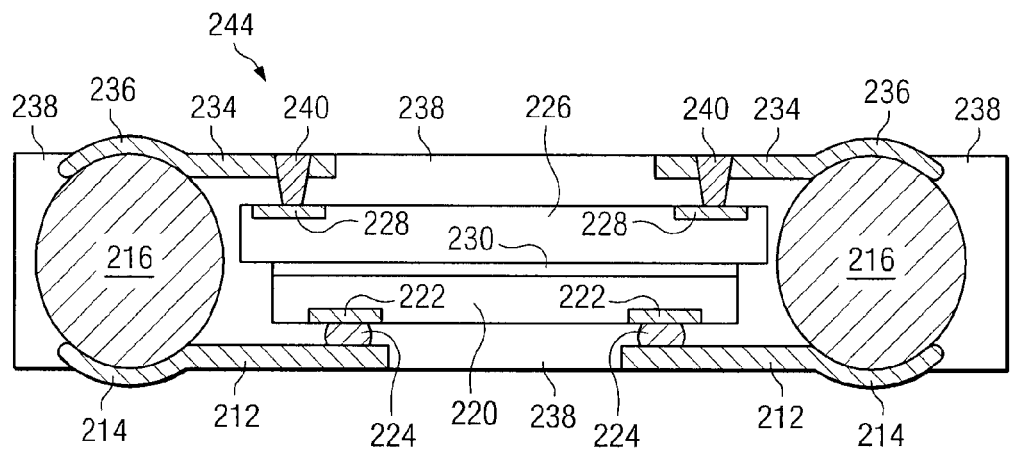

In FIG. 11h, a plurality of vias 240 is formed through conductive layer 234 and encapsulant 238 to contact pads 228 of semiconductor die 226 by DRIE or laser drilling process. The vias 240 are filled with Al, Cu, Sn, Ni, Au, Ag, Ti, W, poly-silicon, or other suitable electrically conductive material using PVD, CVD, electrolytic plating, electroless plating process, or other suitable metal deposition process.

In semiconductor package 244, bumps 216 provide vertical, z-direction interconnect between conductive layers 212 and 234. Conductive layer 212, bumps 216, and conductive layer 234 electrically connect to contact pads 222 of semiconductor die 220 and contact pads 228 of semiconductor die 226 through conductive vias 240 and bumps 224. Semiconductor package 244 offers a lower cost structure by providing top and bottom interconnect surfaces for stacking FO-WLSCP, without forming RDLs as found in the prior art.

Figure 12:
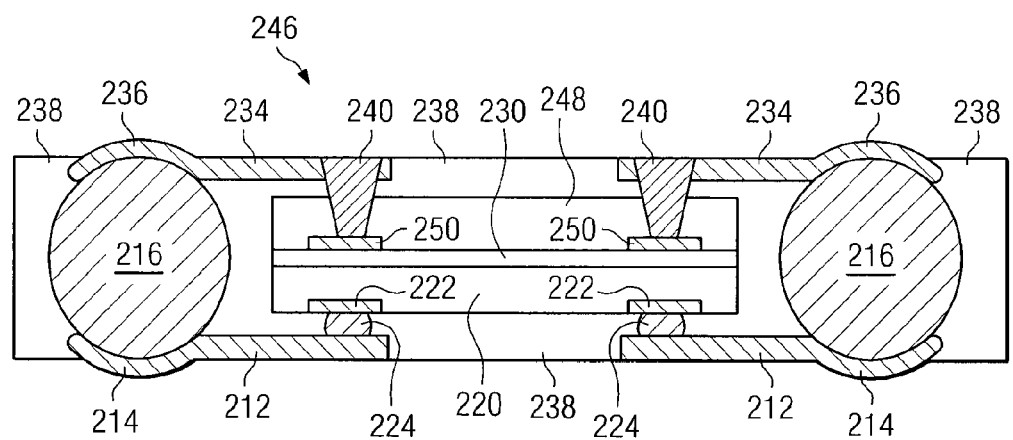
FIG. 12 illustrates the FO-WLCSP with the vertical interconnect structure from FIGS. 11a-11h and similar-sized stacked die.

FIG. 12 shows an embodiment of semiconductor package 246 following the description of FIGS. 11a-11h with semiconductor die 220 and 248 having a similar footprint, for example, because they are equivalent devices.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a first semiconductor die;
a plurality of rounded bumps disposed proximate to the first semiconductor die;
a first conductive layer including a linear portion disposed over the first semiconductor die and non-linear portion disposed over the rounded bumps;
a second conductive layer including a non-linear portion disposed over a non-linear surface of the rounded bumps opposite the first conductive layer;
an encapsulant deposited around the first semiconductor die and rounded bumps; and
a plurality of first conductive vias formed through the encapsulant to electrically connect the linear portion of the first conductive layer to the first semiconductor die.

2. The semiconductor device of claim 1, further including a second semiconductor die disposed over the first semiconductor die.

3. The semiconductor device of claim 2, further including a plurality of second conductive vias formed through the encapsulant to electrically connect the second conductive layer to the second semiconductor die.

4. The semiconductor device of claim 2, further including a plurality of second conductive vias formed through the first semiconductor die or second semiconductor die.

5. The semiconductor device of claim 1, further including a plurality of stacked semiconductor devices electrically connected through the rounded bumps and first and second conductive layers.

6. A semiconductor device, comprising:
a first semiconductor die;
an interconnect structure disposed proximate to the first semiconductor die;
a first conductive layer including a linear portion disposed over the first semiconductor die and a non-linear portion disposed over a first non-linear surface of the interconnect structure;
a second conductive layer including a non-linear portion formed over a second non-linear surface of the interconnect structure opposite the first non-linear surface of the interconnect structure;
an encapsulant deposited around the first semiconductor die and interconnect structure; and
a first conductive via formed through the linear portion of the first conductive layer to the first semiconductor die.

7. The semiconductor device of claim 6, wherein the second conductive layer includes a linear portion extending over the encapsulant.

8. The semiconductor device of claim 6, further including a bump formed between the first conductive layer and the first semiconductor die.

9. The semiconductor device of claim 7, further including a second semiconductor die disposed over the first semiconductor die.

10. The semiconductor device of claim 9, further including a second conductive via formed through the encapsulant and the linear portion of the second conductive layer to electrically connect the second conductive layer to the second semiconductor die.

11. The semiconductor device of claim 7, further including a second semiconductor die disposed over the first semiconductor die and including a similar footprint to the first semiconductor die.

12. The semiconductor device of claim 6, wherein the interconnect structure includes a plurality of rounded bumps.

13. The semiconductor device of claim 6, further including a plurality of stacked semiconductor devices electrically connected through the interconnect structure and first and second conductive layers.

14. The semiconductor device of claim 9, further including an electrical interconnect disposed between the second conductive layer and second semiconductor die.

15. A semiconductor device, comprising:
a semiconductor die;
an interconnect structure including a non-linear surface disposed proximate to the semiconductor die;
a first conductive layer including a non-linear portion conformally disposed over a first portion of the non-linear surface of the interconnect structure and a linear portion extending over the semiconductor die;
a second conductive layer including a non-linear portion conformally disposed over a second portion of the non-linear surface of the interconnect structure opposite the first conductive layer; and
an encapsulant deposited around the semiconductor die and interconnect structure.

16. The semiconductor device of claim 15, further including a conductive via formed through the first conductive layer to electrically connect the first conductive layer to the semiconductor die.

17. The semiconductor device of claim 15, further including a second semiconductor die disposed over the semiconductor die.

18. The semiconductor device of claim 17, further including a conductive via formed through the second conductive layer to electrically connect the second conductive layer to the second semiconductor die.

19. The semiconductor device of claim 17, further including a plurality of bumps disposed within the encapsulant to electrically connect the semiconductor die to the second semiconductor die.

20. The semiconductor device of claim 15, further including an electrical interconnect disposed between the semiconductor die and first conductive layer.

21. A semiconductor device comprising:
a semiconductor die;
an interconnect structure including a non-linear surface disposed proximate to the semiconductor die;
a conductive layer including a linear portion extending over the semiconductor die and a non-linear portion disposed over the non-linear surface of the interconnect structure;
a conductive via formed through the conductive layer and extending to the semiconductor die; and
a second conductive layer disposed over the non-linear surface of the interconnect structure opposite the conductive layer, wherein the second conductive layer includes a non-linear portion disposed over the non-linear surface of the interconnect structure.

22. The semiconductor device of claim 21, further including a second semiconductor die disposed over the semiconductor die, wherein the second conductive layer extends over the second semiconductor die.

23. The semiconductor device of claim 22, further including a second conductive via electrically connecting the second conductive layer to the second semiconductor die.

24. The semiconductor device of claim 22, further including an electrical interconnect disposed between the second conductive layer and second semiconductor die.

25. A semiconductor device, comprising:
a first semiconductor die;
an interconnect structure including a non-linear surface disposed proximate to the first semiconductor die;
a first conductive layer including a non-linear portion disposed over the non-linear surface of the interconnect structure;
an encapsulant deposited around the first semiconductor die and interconnect structure, wherein the first conductive layer extends over the first semiconductor die; and
an electrical interconnect disposed between the first semiconductor die and a lateral surface of the first conductive layer over the first semiconductor die.

26. The semiconductor device of claim 25, further including a second conductive layer disposed over the non-linear surface of the interconnect structure opposite the first conductive layer.

27. The semiconductor device of claim 26, further including a second semiconductor die disposed over the first semiconductor die, wherein the second conductive layer extends over the second semiconductor die.

28. The semiconductor device of claim 27, further including a second electrical interconnect disposed between the second conductive layer and second semiconductor die.

* * * * *